United States Patent
Ono et al.

(10) Patent No.: US 7,227,225 B2
(45) Date of Patent: Jun. 5, 2007

(54) SEMICONDUCTOR DEVICE HAVING A VERTICAL MOS TRENCH GATE STRUCTURE

(75) Inventors: Syotaro Ono, Yokohama (JP); Yusuke Kawaguchi, Miura-gun (JP); Akio Nakagawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/829,173

(22) Filed: Apr. 22, 2004

(65) Prior Publication Data

US 2005/0001264 A1    Jan. 6, 2005

(30) Foreign Application Priority Data

Apr. 23, 2003    (JP)    ............... 2003-118462

(51) Int. Cl.
*H01L 29/76*    (2006.01)
(52) U.S. Cl. ............... 257/331; 257/E29.134
(58) Field of Classification Search ............... 257/135, 257/136, 328–331, E29.134, E29.264
See application file for complete search history.

(56) References Cited

U.S. PATENT DOCUMENTS

| | | | | |
|---|---|---|---|---|
| 4,541,001 A | * | 9/1985 | Schutten et al. | ............ 257/331 |
| 5,072,266 A | * | 12/1991 | Bulucea et al. | ............ 257/330 |
| 5,126,807 A | * | 6/1992 | Baba et al. | ............ 257/401 |
| 5,776,812 A | * | 7/1998 | Takahashi et al. | ............ 438/268 |
| 5,929,481 A | * | 7/1999 | Hshieh et al. | ............ 257/328 |
| 6,015,737 A | * | 1/2000 | Tokura et al. | ............ 438/270 |
| 6,093,606 A | * | 7/2000 | Lin et al. | ............ 438/259 |

FOREIGN PATENT DOCUMENTS

| | | |
|---|---|---|
| JP | 5-7002 | 1/1993 |
| JP | 9-181311 | 7/1997 |
| JP | 2000-269487 | 9/2000 |
| JP | 20010077358 A * | 3/2001 |
| JP | 2001-119023 | 4/2001 |
| JP | 2002-26324 | 1/2002 |
| JP | 2002-94061 | 3/2002 |

* cited by examiner

*Primary Examiner*—Thomas L. Dickey
(74) *Attorney, Agent, or Firm*—Oblon, Spivak, McClelland, Maier & Neustadt, P.C.

(57) ABSTRACT

A second semiconductor region is formed on a first semiconductor region. A third semiconductor region is formed on a part of the second semiconductor region. A trench ranges from a surface of the third semiconductor region to the third semiconductor region and the second semiconductor region. The trench penetrates the third semiconductor region, and the depth of the trench is shorter than that of a deepest bottom portion of the second semiconductor region, and the second semiconductor region does not exist under a bottom surface of the trench. A gate insulating film is formed on facing side surfaces of the trench. First and second gate electrodes are formed on the gate insulating film. The first and second gate electrodes are separated from each other. The conductive material is formed between the first and second gate electrodes on the side surfaces of the trench, with an insulating film intervened therebetween.

12 Claims, 4 Drawing Sheets

SEMICONDUCTOR DEVICE HAVING A VERTICAL MOS TRENCH GATE STRUCTURE

CROSS-REFERENCE TO RELATED APPLICATIONS

This application is based upon and claims the benefit of priority from prior Japanese Patent Application No. 2003-118462, filed Apr. 23, 2003, the entire contents of which are incorporated herein by reference.

BACKGROUND OF THE INVENTION

1. Field of the Invention

This invention relates to a semiconductor device, in particular a semiconductor device having a vertical MOS (Metal-Oxide-Semiconductor) gate structure, which requires a high-speed switching property, and a method of manufacturing the same.

2. Description of the Related Art

In conventional art, a trench-gate structures formed by using a trench formed at a principal surface of a semiconductor device is applied to semiconductor devices, such as IGBT (Insulated Gate Bipolar Transistor) and MOSFET (Field Effect Transistor), and is an advantageous structure in, in particular, use for electricity.

For example, MOSFETS having a trench-gate structure have a high switching speed, a large current capacity, and a capacity of breakdown voltage of tens to hundreds, and thus have come into wide use. For example, they are used as a switching power supply for Pocket mobile communications apparatus and personal computers.

In particular, with increase in speed and efficiency of power supply systems, reducing an on-resistance and a gate-drain feedback capacitance of devices is regarded as important increasingly, in power MOSFETs used for DC—DC converters. FIG. 1 shows a cross-sectional structure of a conventional trench-gate type MOSFET (for example, please refer to Jpn. Pat. Appln. KOKAI Pub. No. 5-7002).

However, in the conventional trench-gate type MOSFET shown in FIG. 1, a gate electrode 101 has a large facing area on an n-type semiconductor layer (drain layer), and thus the MOSFET has a large gate-drain capacitance. Therefore, it has a problem that a Miller charging period at the time of turning on and off the device is long, and that a high-speed switching cannot be achieved. Thus, to achieve high speed (high frequency) and high efficiency of power supply systems, it is urgently necessary to reduce the on-resistance and the gate-drain capacitance.

BRIEF SUMMARY OF THE INVENTION

According to one aspect of the present invention, a semiconductor device comprises: a first semiconductor region of a first conductivity type; a second semiconductor region of a second conductivity type formed on the first semiconductor region; a third semiconductor region of the first conductivity type formed on a part of the second semiconductor region; a trench formed to range from a surface of the third semiconductor region to the third semiconductor region and the second semiconductor region, the trench penetrating the third semiconductor region, a depth of the trench being shorter than a depth of a deepest bottom portion of the second semiconductor region, and the trench having no second semiconductor region under its bottom surface; a gate insulating film formed on both facing side surfaces of the trench; first and second gate electrodes formed on the gate insulating film on the respective facing side surfaces of the trench, the first and second electrodes being separated from each other; and a conductive material formed between the first and second gate electrodes on the side surfaces of the trench, with an insulating film intervened between the conductive material and the first and second gate electrodes.

Further, according to one aspect of the present invention, a method of manufacturing the semiconductor device comprises: forming a first semiconductor region on a semiconductor substrate; forming a trench of a predetermined depth in the first semiconductor region; forming a second semiconductor region on a surface region of the first semiconductor region, the second semiconductor region contacting side surfaces of the trench; forming a gate insulating film on the facing side surfaces of the trench; depositing a conductive film on the gate insulating film; subjecting the conductive film to anisotropic etching, and leaving the conductive film only on the side surfaces of the trench; and ion-implanting impurities into the first semiconductor region by self alignment, with the conductive film on the side surfaces of the trench used as a mask, and forming a fourth semiconductor region under a bottom surface of the trench.

DETAILED DESCRIPTION OF THE INVENTION

Figure 1:
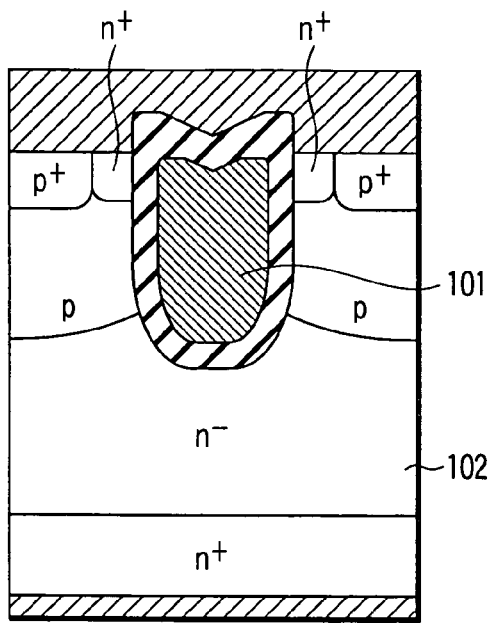
FIG. 1 is a cross-sectional view showing a structure of a conventional trench-gate type MOSFET.

Embodiments of the present invention will now be explained with reference to the drawings. Like reference numerals denote like constituent elements through the drawings.

Figure 2:
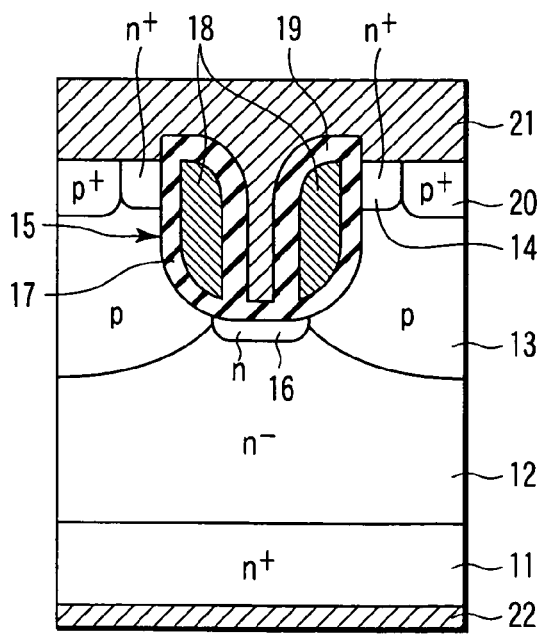
FIG. 2 is a cross-sectional view showing a structure of a MOSFET according to a first embodiment of the present invention.

First, a semiconductor device according to a first embodiment of the present invention will now be described. FIG. 2 is a cross-sectional view showing a structure of a MOSFET of the first embodiment.

As shown in FIG. 2, an n– type epitaxial layer 12 is formed on one principal surface of an n+ type semiconductor substrate 11. A p type base region 13 is formed on the n– type epitaxial layer 12. Further, n+ type source regions 14 are formed on a surface region of the p type base region 13.

A trench 15 is formed in the n+ type source regions 14 and the p type base region 13. The trench 15 has a predetermined depth and penetrates the n+ type source regions 14 and the p type base region 13 from the surfaces of the n+ type source regions 14. The predetermined depth of the trench 15 is shorter than the depth of a deepest bottom portion of the p type base region 13. No p type base region 13 exists under the bottom surface of the trench 15, but n– type epitaxial layer 12 exists. The p type base region 13 in the vicinity of the side surfaces of the trench 15 has a form of bulging toward the substrate (a portion of the p type base region 13 distant from the trench 15 is deeper than a portion of the base region 13 adjacent to the trench 15), and thereby the above structure can be formed. Further, an n type semiconductor region 16 having an impurity concentration higher than that of the n– type epitaxial layer 12 is formed between the bottom surface of the trench 15 and the n– type epitaxial layer 12.

A gate insulating film 17 is formed on the side surfaces of the trench 15, and separated gate electrodes (for example, polysilicon) 18 are formed on the gate insulating film 17 on the respective side surfaces. In other words, gate electrodes 18, separated from each other, are formed on the respective side surfaces of the trench 15. Further, an insulating film (for example, an oxide film) 19 is formed on each of the gate electrodes 18. The gate electrodes 18 are connected to gate wirings (not shown).

The n+ type source regions 14 which adjoin the side surfaces of the trench 15 are located on the p type base region 13. Further, p+ type semiconductor regions 20 are formed adjacent to the respective n+ type source regions 14. Each of the p+ type semiconductor regions 20 is provided to form an ohmic contact between a source electrode described below and the p type base region 13.

A source electrode 21 is formed on the insulating film 19, the n+ type source regions 14, and the p+ type semiconductor regions 20, and is embedded between the gate electrodes 18 in the trench 15 with the insulating films 19 intervened. Further, a drain electrode 22 is formed on the other principal surface of the n+ type semiconductor substrate 11 facing the one principal surface.

The trench-gate type MOSFET having such a structure can minimize an overlapping area between the gate and the drain, that is, the area in which the gate electrodes 18 face the n type semiconductor region 16. Therefore, it is possible to reduce the capacitance formed between the gate and the drain.

Further, the source electrode 21 is formed between the gate electrodes 18 separately formed on the side surfaces of the trench 15, with the insulating films intervened, and on the insulating film on the bottom surface of the trench 15, thereby the n type semiconductor region 16 under the bottom surface of the trench 15 can have an impurity concentration higher than that of the general n– type epitaxial layer 12 by the effect of field plate. Specifically, breakdown voltage of the MOSFET does not fall, even if the impurity concentration of the n type semiconductor region 16 is set to be higher than that of the n– type epitaxial layer 12. Thereby, it is possible to form a MOSFET having a minimized switching capacitance between the gate and the drain, and a low on-resistance.

Next, a method of manufacturing the MOSFET of the first embodiment will now be explained.

FIG. 3A, FIG. 3B, FIG. 3C, FIG. 4A, FIG. 4B and FIG. 4C are cross-sectional views showing steps of a method of manufacturing the MOSFET of the first embodiment.

Figure 3A:
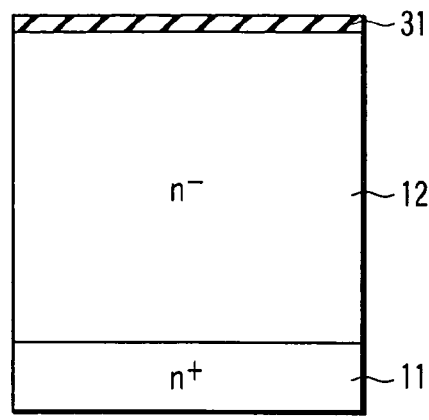
FIGS. 3A–3C are cross-sectional views showing steps of a manufacturing method of the MOSFET of the first embodiment.

First, as shown in FIG. 3A, an n– type epitaxial layer 12 is formed on one principal surface of an n+ type semiconductor substrate 11, by epitaxial growth. Thereafter, an oxide film 31 is formed on the n– type epitaxial layer 12 by thermal oxidation.

Figure 3B:
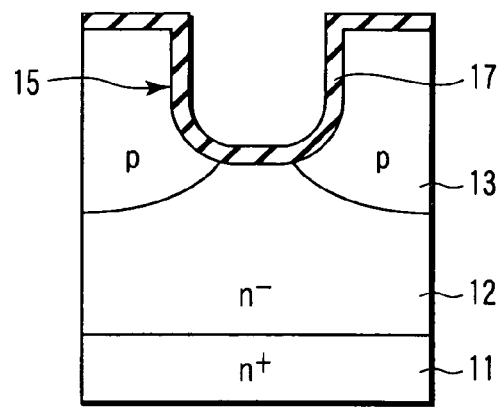

Then p type impurities, such as boron (B), are injected into the n– type epitaxial layer 12 by ion implantation, and thermal treatment is performed to from a p type base region 13. Further, anisotropic etching is performed by reactive ion etching (hereinafter referred to as RIE), and a trench 15 having a predetermined depth is formed in the p type base region 13, as shown in FIG. 3B. Thereafter, the oxide film 31 is removed, and a gate insulating film 17 is formed on the side surfaces of the trench 15 by thermal oxidation.

Figure 3C:
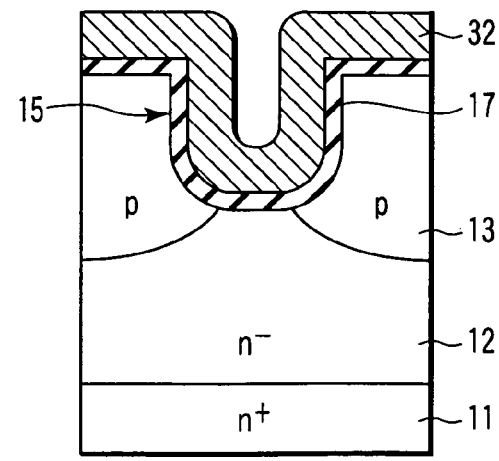
Figure 4A:
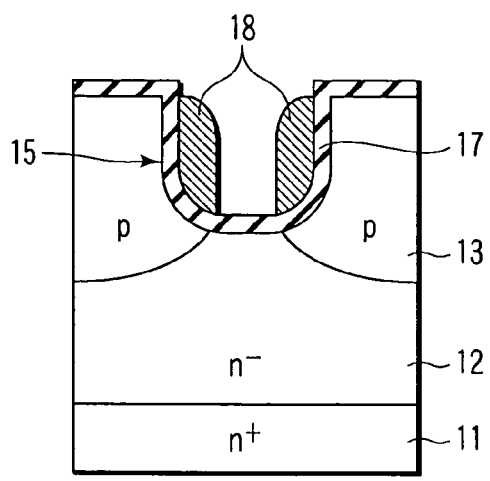
FIGS. 4A–4C are cross-sectional views of other steps of the manufacturing method of the MOSFET of the first embodiment.

Then, a polysilicon film 32 is deposited on the structure shown in FIG. 3B, that is, on the gate insulating film 17, as shown in FIG. 3C. Further, the polysilicon film 32 is subjected to anisotropic etching by RIE, and thereby the polysilicon serving as gate electrodes 18 is left only on the side surfaces of the trench 15, as shown in FIG. 4A.

Figure 4B:
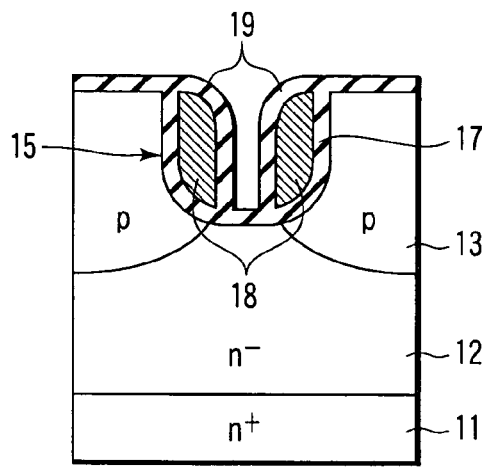
Figure 4C:
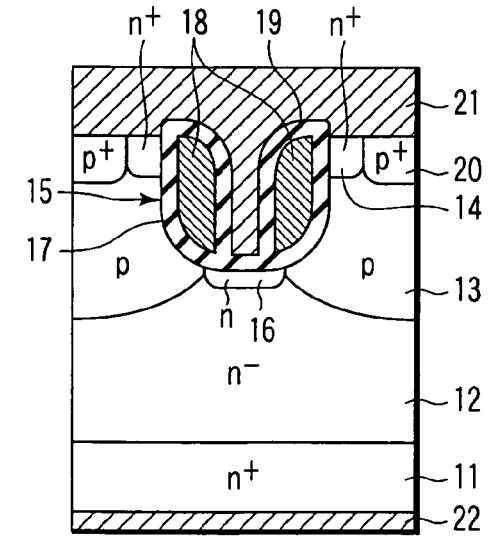

Next, as shown in FIG. 4B, an insulating film 19 being an oxide film, etc. is formed on the gate electrodes 18 by after-oxidation or CVD. Then, n type impurities, such as phosphorus (P) or arsenic (As), are ion-implanted by self-alignment step with the gate electrodes 18 used as mask, and thereby an n type semiconductor region 16 is formed under the bottom surface of the trench 15. In this step (ion-implanting n type impurities into the bottom portion), the insulating film on the gate electrode and on the bottom portion of the trench held between the gate electrodes may have already been removed.

Further, n type impurities, such as phosphorus (P) or arsenic (As), are ion-implanted into surface regions of the p type base regions 13 contacting the side surfaces of the trench 15, and thereby n+ type source regions 14 are selectively formed. Further, p+ type impurities, such as boron (B), are ion-implanted into the surface regions of the p type base regions 13, and thereby a p+ type semiconductor region 20 is formed.

Thereafter, a source electrode 21 is formed on the N+ type source regions 14, p+ type semiconductor regions 20, and the insulating film 19. Further, a drain electrode 22 is formed on the other principal surface facing the one principal surface of the n+ type semiconductor substrate 11. The MOSFET shown in FIG. 2 is manufactured by the above process.

In the above manufacturing process, the n type semiconductor region (drain region) 16, which faces the gate electrodes 18 with the insulating film 17 on the bottom surface of the trench 15 intervened therebetween, can be minimized, by ion-implanting n-type impurity ions in the state where the insulating film 19 has been grown or deposited on the gate electrodes 18. Further, a channel is formed in the p type base regions 13 contacting the side surfaces and a part of the bottom surface of the trench 15 and facing the polysilicon film with the gate insulating film 17 intervened, by forming the n+ type source regions 14 on the surface portion of the device and connecting the each polysilicon films (gate electrodes) left on the side surfaces of the trench 15 with the gate wirings.

Next, MOSFETs of other embodiments of the present invention will now be explained.

Figure 5:
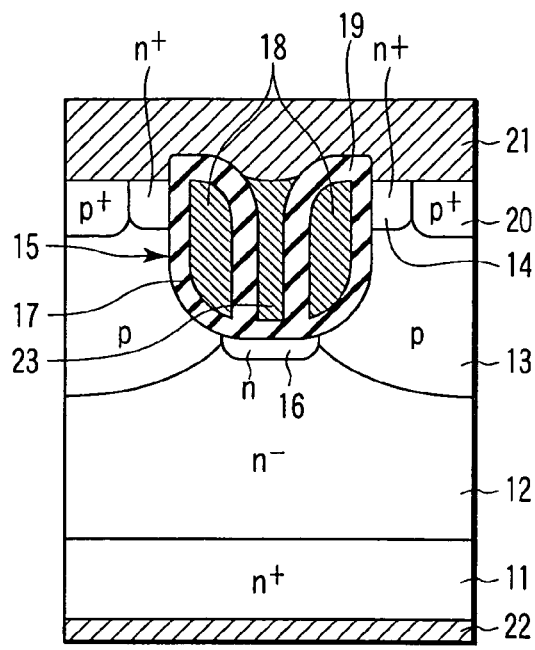
FIG. 5 is a cross-sectional view showing a structure of a MOSFET according to a second embodiment of the present invention.

FIG. 5 is a cross-sectional view showing a structure of a MOSFET according to a second embodiment of the present invention.

In the first embodiment, a part of the source electrode 21 is embedded between the separated gate electrodes 18 in the trench 15 with the insulating film 19 intervened therebetween. However, the conductive material to be formed between the gate electrodes 18 does not have to be always formed of the same material as that of the source electrode 21 as a unitary one-piece structure with the source electrode 21, or connected directly to the source electrode 21, as in the first embodiment.

For example, as shown in FIG. 5, a conductive material 23, made of a substance different from that of the source electrode 21, may be embedded between separated gate electrodes 18 in a trench 15, with an insulating film 19 intervened therebetween. The other structures and effects of the embodiment are the same as those of the first embodiment.

Figure 6:
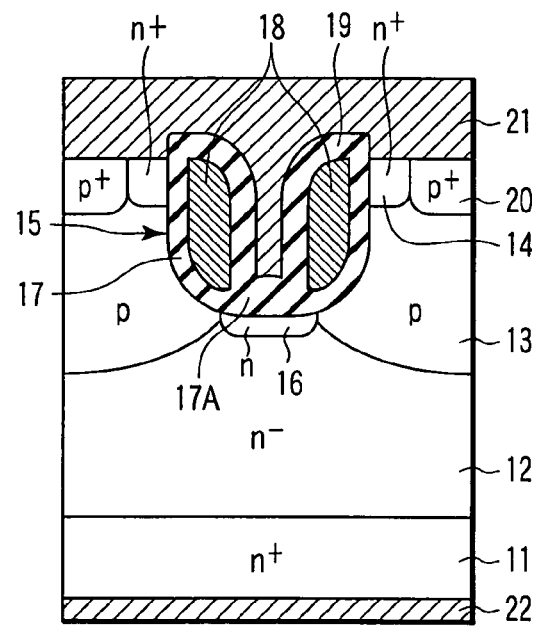
FIG. 6 is a cross-sectional view showing a structure of a MOSFET according to a third embodiment of the present invention.

Further, FIG. 6 shows a structure of a MOSFET according to a third embodiment of the present invention. As shown in FIG. 6, the thickness of an insulating film 17A on the bottom surface of a trench 15 may be formed thicker than that of a gate insulating film 17 formed on the side surfaces (on channel portions) of the trench 15. This structure is achieved by further adding an after-oxidation after etching its polysilicon film by RIE. Such a structure can further reduce the feedback capacitance between the gate and the drain and increase the switching speed, in comparison with the first embodiment. The other structures and effects of this embodiment are the same as those of the first embodiment.

Figure 7:
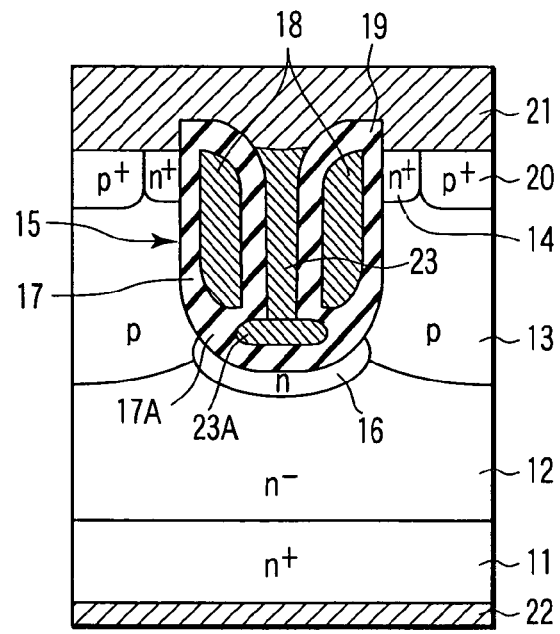
FIG. 7 is a cross-sectional view showing a structure of a MOSFET according to a fourth embodiment of the present invention.

FIG. 7 is a cross-sectional view showing a structure of a MOSFET according to a fourth embodiment of the present invention. In the second embodiment, the conductive material 23, made of a substance different from that of the source electrode 21, is embedded between the separated gate electrodes 18 in the trench 15, with the insulating film 19 intervened therebetween. In comparison with this, in the fourth embodiment, a conductive material 23A entering below gate electrodes 18 is further formed under a conductive material 23, as shown in FIG. 7. In other words, the conductive material 23A extending from under the conductive material 23 to below the gate electrodes 18 is formed to be opposed to an n type semiconductor region 16. Further, the conductive material 23A is electrically connected to the conductive material 23. Insulating films are disposed between the gate electrodes 18 and the conductive material 23A, and an insulating material is also formed between the conductive material 23A and the n type semiconductor region 16. The conductive material 23A and the conductive material 23 may be formed as one unitary piece, so as to connect with each other.

Such a structure as described above further reduces the capacitance between the gate and the drain and improves the switching speed, in comparison with the second embodiment and the case of forming a thick insulating film 17A explained in the third embodiment. The other structures and effects of this embodiment are the same as those of the second embodiment.

Figure 8:
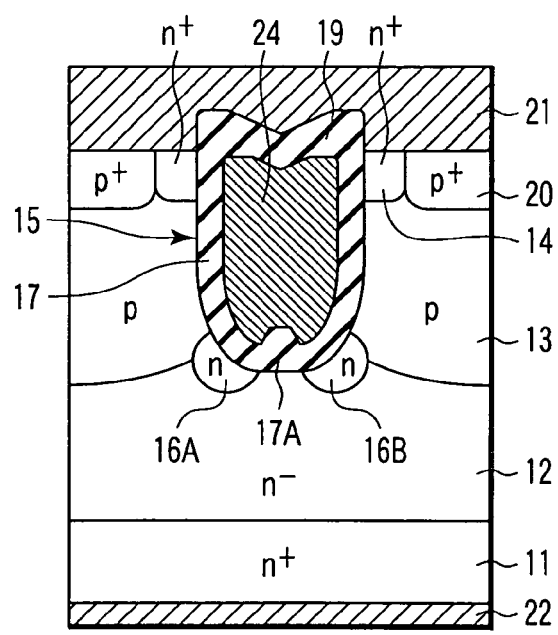
FIG. 8 is a cross-sectional view showing a structure of a MOSFET according to a fifth embodiment of the present invention.

Furthermore, FIG. 8 is a cross-sectional view showing a structure of a MOSFET according to a fifth embodiment of the present invention. Although in the first embodiment the two separated gate electrodes 18 are formed on the side surfaces of the trench 15, in the fifth embodiment, one gate electrode 24 is formed in a trench 15. Further, an insulating film 17A on the bottom surface of the trench 15 is formed thicker than a gate insulating film 17 formed on the side surfaces (on channel portions) of the trench 15. In addition, separated n+ type semiconductor regions 16A and 16B are formed only on boundary portions between p type base regions 13 below the gate electrode 24 and the n− type epitaxial layer 12. Such a structure can reduce the capacitance between the gate and the drain, and improve the switching speed. Further, it causes no fear that the resistance of the gate electrode is increased, which is described below. The other structures and effects of this embodiment are the same as those of the first embodiment.

Furthermore, the above first to fourth embodiments having two separated gate electrodes have a fear that the resistance of the gate electrodes is increased. However, this problem can be overcome by adopting the following structure.

For example, the silicidation process is introduced. After the polysilicon film has been etched by RIE, depositing metal (for example titanium (Ti), cobalt (Co) and so on) on the polysilicon film by the method of sputtering, and subjecting it to heat treatment. This can reduce the resistance of the gate electrodes. This can form a silicidation area broader than that of a conventional structure having a non-separated gate, and thus effectively reduce the gate resistance.

Figure 9:
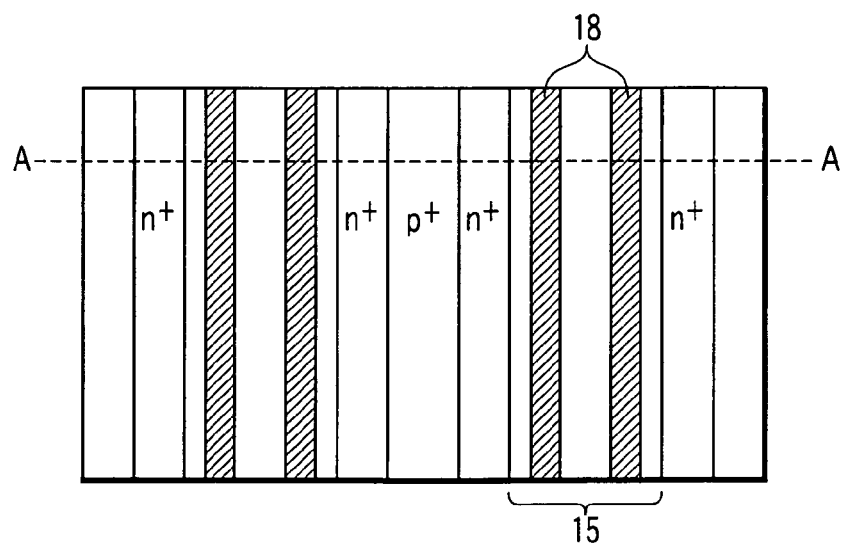
FIG. 9 is a plan view showing a layout of trenches and gate electrodes in a MOSFET of a reference example.
Figure 10:
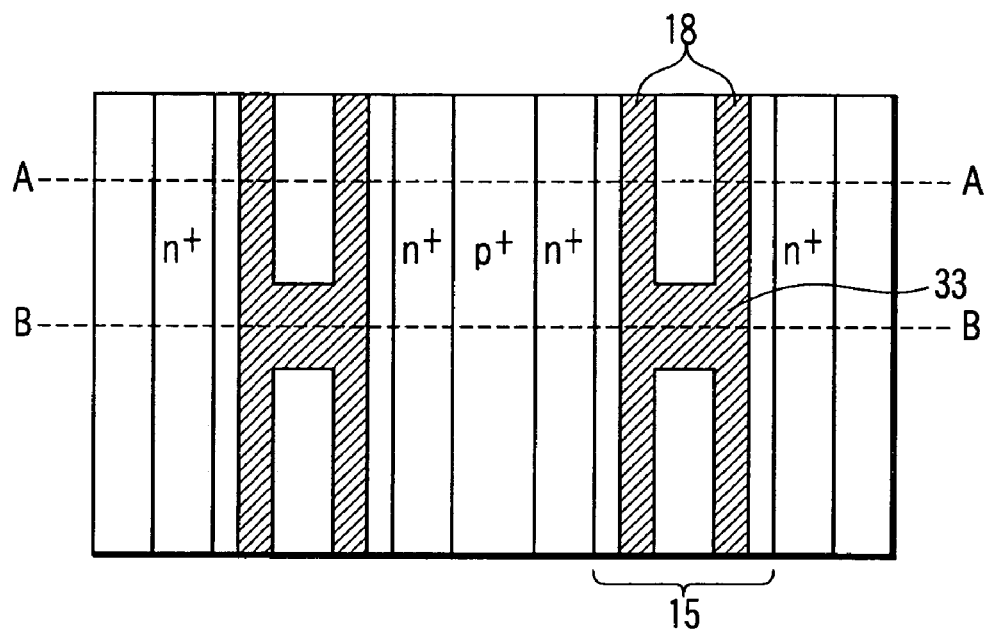
FIG. 10 is a plan view showing a layout of trenches and gate electrodes in the embodiment of the present invention.

Further, in the plan view as viewed from the surface of the device, generally the trench 15 and the gate electrodes 18 are arranged in stripes, as shown in FIG. 9. In comparison with this, in the above first to third embodiments, as shown in FIG. 10, a part 33, which is a part of two polysilicon wirings forming the two gate electrodes 18 and connects the two polysilicon wirings, is formed by leaving polysilicon between the two polysilicon wirings. This can reduce the resistance of the gate electrodes 18.

Figure 11:
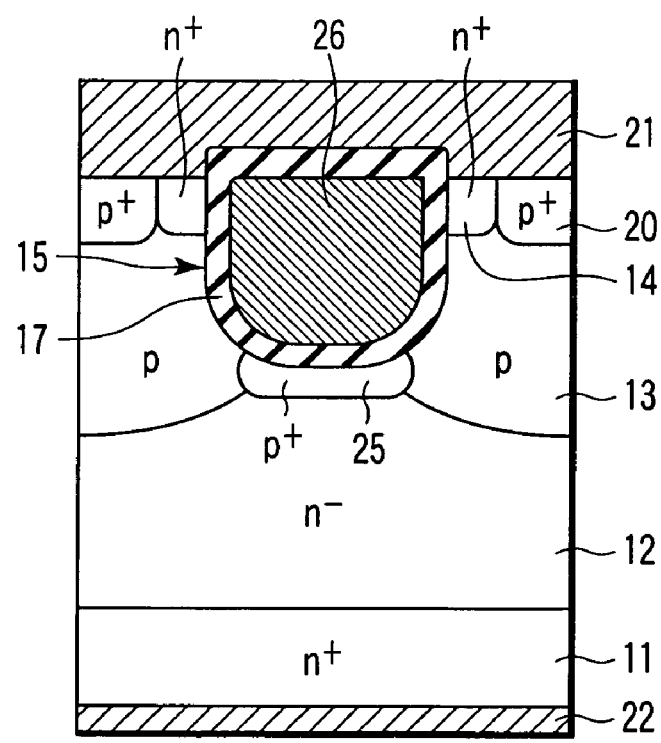
FIG. 11 is a cross-sectional view taken along a line B—B in FIG. 10.

Cross-sections taken along line A—A in FIGS. 9 and 10 are as shown in FIGS. 2, 5 and 6. A cross-section taken along line B–B in FIG. 10 is shown in FIG. 11. If a part 33 being a part of the gate electrodes 18 is formed by leaving the polysilicon in the trench 15 as shown in FIG. 10, not an n type semiconductor region but a p+ type semiconductor region 25 having an impurity concentration higher than that of the p type base regions 13 is formed under the bottom surface of the trench 15, as shown in FIG. 11. This is to prevent inversion of the p+ type semiconductor region 25 even when the gate voltage is applied, since the gate electrode 26 is embedded in the whole trench 15 in the cross-sectional structure shown in FIG. 11 and thus the feedback capacitance between the gate and the drain increases. Although in FIG. 11 a p+ type semiconductor region exists only under the bottom surface of the trench 15, the channel portions on the side surfaces of the trench 15 also may be p+ type semiconductor regions having an impurity concentration higher than that of the p type base regions 13.

In the above embodiment, the first conductive type is an n type, and the second conductive type is a p type. However, even if the first conductive type is a p type and the second conductive type is an n type, a similar effect to those of the embodiments of the present application can be obtained.

As described above, according to the embodiments of the present invention, it is possible to provide a semiconductor device having a low on-resistance and a high-speed switching property, and a method of manufacturing the same.

Further, the aforementioned embodiments can be carried out separately or in combination. Furthermore, each of the aforementioned embodiments includes various inventions of various steps and stages, and it is possible to extract inventions of various steps and stages by properly combining the plural constituent features disclosed in the embodiments. Furthermore, the embodiments of the present invention can be carried out with various modifications without deviating from the gist.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first semiconductor region of a first conductivity type;
a second semiconductor region of a second conductivity type formed on the first semiconductor region;
a third semiconductor region of the first conductivity type formed on a part of the second semiconductor region;
a trench formed to range from a surface of the third semiconductor region to the third semiconductor region and the second semiconductor region, the trench penetrating the third semiconductor region, a depth of the trench being shorter than a depth of a deepest bottom portion of the second semiconductor region;
a gate insulating film formed on both facing side surfaces of the trench;
first and second gate electrodes formed on the gate insulating film and opposed to the facing side surfaces of the trench, the first and second gate electrodes being separated from each other, the separated first and second gate electrodes including, in a cross sectional cut in a depth direction of the trench and including the first and second gate electrodes, at least one portion to which the first and second gate electrodes are not connected;
a first conductive material formed between the first and second gate electrodes on the side surfaces of the trench, with an insulating film intervened between the first conductive material and the first and second gate electrodes,
wherein a boundary portion between the first semiconductor region and the second semiconductor region and a bottom portion of the trench cross each other; and
a fifth semiconductor region of the second conductivity type formed on a part of the second semiconductor region, the fifth semiconductor region having an impurity concentration higher than an impurity concentration of the second semiconductor region; and a source electrode formed on the fifth semiconductor region and the third semiconductor region.

2. A semiconductor device according to claim 1, further comprising a fourth semiconductor region of the first conductivity type formed between the bottom surface of the trench and the first semiconductor region, the fourth semiconductor region having an impurity concentration higher than an impurity concentration of the first semiconductor region.

3. A semiconductor device according to claim 2, the fourth semiconductor region being arranged apart in boundary regions of the first semiconductor region and the second semiconductor region.

4. A semiconductor device according to claim 1, the first conductive material being electrically connected to the source electrode.

5. A semiconductor device according to claim 1, the first conductive material being a floating electrode.

6. A semiconductor device according to claim 1, further comprising an insulating film formed between the bottom surface of the trench and the separated first and second gate electrodes, and between the bottom surface of the trench and the first conductive material, and insulating film having a film thickness greater than a thickness of the gate insulating film formed on the side surfaces of the trench.

7. A semiconductor device according to claim 1, the first semiconductor region forming a drain region, the second semiconductor region forming a base region, and the third semiconductor region forming a source region, and the first to third semiconductor regions being formed into a MOS field-effect transistor.

8. A semiconductor device according to claim 1, further comprising a second conductive material formed under the first conductive material and extending below the first and the second gate electrodes.

9. A semiconductor device according to claim 1, wherein a deepest portion of the second semiconductor region has an impurity concentration not higher than an impurity concentration of a channel region of the second semiconductor region formed along side surfaces of a trench on which the first and second gate electrodes are formed.

10. A semiconductor device comprising:
a first semiconductor region of a first conductivity type;
a second semiconductor region of a second conductivity type formed on the first semiconductor region;
a third semiconductor region of the first conductivity type formed on a part of the second semiconductor region;
a trench formed to range from a surface of the third semiconductor region to the third semiconductor region and the second semiconductor region, the trench penetrating the third semiconductor region, a depth of the trench being shorter than a depth of a deepest bottom portion of the second semiconductor region;
a gate insulating film formed on both facing side surfaces of the trench;
first and second gate electrodes formed on the gate insulating film and opposed to the facing side surfaces of the trench, the first and second gate electrodes being separated from each other, the separated first and second gate electrodes being connected to each other at a part thereof inside the trench above a non-inversion region beneath the trench;
a first conductive material formed between the first and second gate electrodes on the side surfaces of the trench, with an insulating film intervened between the first conductive material and the first and second gate electrodes; and
a fourth semiconductor region of the second conductivity type formed between the first semiconductor region and a bottom surface of the trench located under the part, at which the separated first and second gate electrode are connected, the fourth semiconductor region having an impurity concentration higher than an impurity concentration of the second semiconductor region.

11. A semiconductor device according to claim 10 wherein a boundary portion between the first semiconductor region and the second semiconductor region and a bottom portion of the trench cross each other.

12. A semiconductor device according to claim 10, wherein a deepest portion of the second semiconductor region has an impurity concentration not higher than an impurity concentration of a channel region of the second semiconductor region formed along side surfaces of a trench on which the first and second gate electrodes are formed.

* * * * *